United States Patent [19]

Heitzmann et al.

[11] Patent Number: 4,566,027
[45] Date of Patent: Jan. 21, 1986

[54] PRE-MATCHED MODULE FOR AN ULTRA-HIGH FREQUENCY DIODE WITH HIGH HEAT DISSIPATION

[75] Inventors: Michel Heitzmann, Combs la Ville; Marianne Boudot, Clichy, both of France

[73] Assignee: Thomson-CSF, Paris, France

[21] Appl. No.: 554,099

[22] Filed: Nov. 21, 1983

[30] Foreign Application Priority Data

Nov. 23, 1982 [FR] France .................. 82 19585

[51] Int. Cl.⁴ ............... H01L 23/56; H01L 23/04
[52] U.S. Cl. .................................... 357/81; 357/74
[58] Field of Search ..................... 357/81; 372/36

[56] References Cited

U.S. PATENT DOCUMENTS

| | | |
|---|---|---|
| 3,872,496 | 3/1975 | Potter ............................ 357/81 |
| 3,974,518 | 8/1976 | Lewis, Jr. et al. ............. 357/81 |
| 4,189,342 | 2/1980 | Kock ............................ 156/656 |

FOREIGN PATENT DOCUMENTS

| | | |
|---|---|---|
| 0018174 | 10/1980 | European Pat. Off. |
| 2348832 | 4/1975 | Fed. Rep. of Germany |
| 2244264 | 4/1975 | France |
| 0108757 | 6/1983 | Japan .......................... 357/81 |

OTHER PUBLICATIONS

Russell, E. M., and Thomson, I., *Embedded Diamond Heat Sinks for Avalanche Diodes,* Proceedings of the IEEE, Aug. 1972, vol. 60, No. 8.

English, D. L. et al., *Improved Performance of Millimetre-Wave Impatt Diodes on Type II a Diamond Heat Sinks,* Electronics Letters, Dec. 1976, vol. 12, No. 25.

Dymeut, J. C. et al., *Continuous Operation of GaAs Junction Lasers on Diamond Heat Sinks at 200° K.,* Applied Physics Letters, Nov. 1967, vol. 11, No. 9.

IEEE Transactions on Microwave Theory and Techniques, vol. MTT-27, No. 5, May 1979, NY, T. A. Midford et al., "Millimeter-Wave CW IMPATT Diodes and Oscillators", pp. 483-492.

*Primary Examiner*—James W. Davie
*Assistant Examiner*—Vangelis Economou
*Attorney, Agent, or Firm*—Oblon, Fisher, Spivak, McClelland & Maier

[57] ABSTRACT

A pre-matched module is provided for an ultra-high frequency diode with high heat dissipation, comprising a diode chip biassed by a connection and mounted inside a case formed by a metal base, a quartz ring and a metal cap. The base of the case comprises two fixed and metal-coated diamonds one of which has dimensions very much greater than those of the other central diamond, these two diamonds allowing the heat released by the diode to be removed to a maximum and allowing the cap to provide, because of its dimensions and those of the diamond and of the ring, good radial impedance transformation.

8 Claims, 3 Drawing Figures

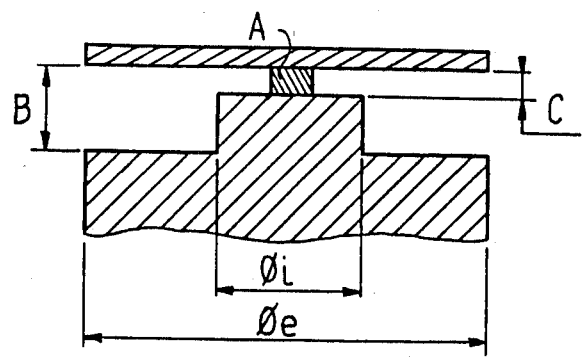
FIG_1
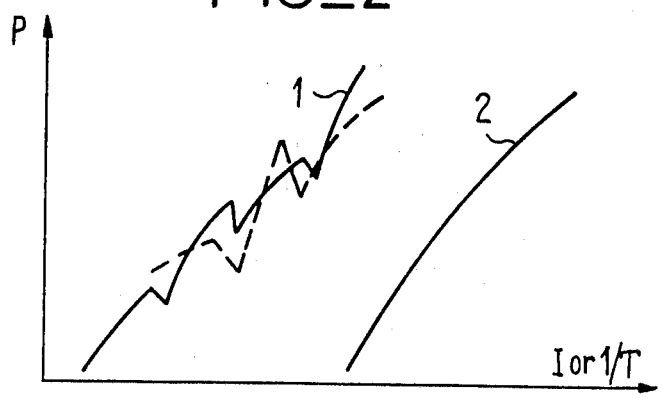
FIG_2
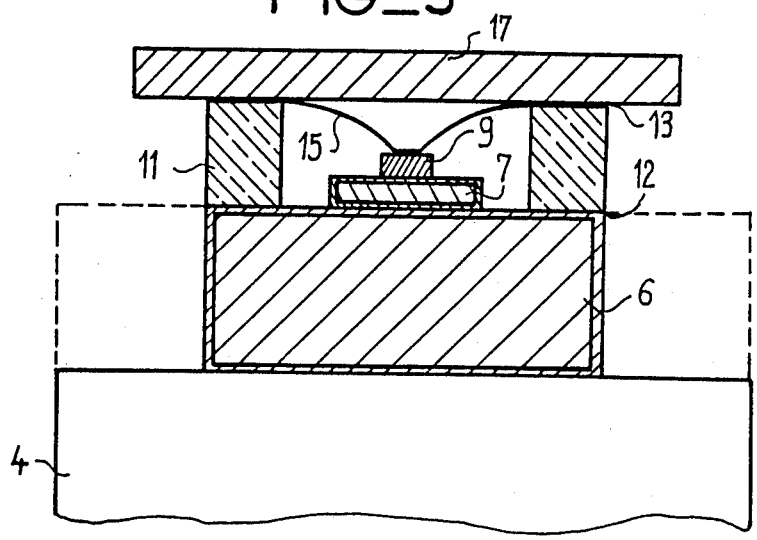
FIG_3

PRE-MATCHED MODULE FOR AN ULTRA-HIGH FREQUENCY DIODE WITH HIGH HEAT DISSIPATION

BACKGROUND OF THE INVENTION

1. Field of the Invention

The present invention relates generally to ultra-high frequency diodes working more especially in the 94 GHz band and encapsulated in a case for forming a module which is pre-matched by using the dimensions of the encapsulation case, and relates more particularly to such a pre-matched module for an ultra-high frequency diode with high heat dissipation.

By pre-matched module is meant a module for matching the low impedance of the diode to the high impedance of the surrounding environment, generally air.

2. Description of the Prior Art

It is known that impedance matching is required in ultra-high frequency operation, especially at frequencies close to 100 GHz, for a diode which is to radiate in the space which surrounds it. This matching is particularly advantageous in a radial form for it may be obtained by means of an adequate case.

A pre-matched or pre-tuned module structure is already known for an ultra-high frequency diode, of the Gunn, avalanche or Schottky type. Thus a known pre-matched module comprises a diode chip fixed inside an encapsulation case formed by a metal base with a central stud or point forming a first connection, a quartz ring surrounding the diode, a metal cap and a second false beam-lead type connection in the form of an non flat metal star the ends of whose arms bear on the face of the quartz ring in contact with the closure cap, and whose center is in contact with the diode chip.

Furthermore, during use of the diode for continuous operation or for pulsed operation, the part of the junction which heats up the most is the part nearest the metal base. There then arises the problem of removing the heat released by the junction when operating. To this end, the diode chip mentioned hereabove is equipped with an integrated heat sink formed by a gold plate of small dimensions, namely 200 microns square and 50 microns thick, which is fixed to the metal base.

However, because of its small dimensions and because of the value of the heat conductivity of gold, of the order of 3.1 W/cm°K. at 200° C., such a gold heat sink does not dissipate as much could be desired the heat generated by the diode during use thereof. Moreover, with this type of heat sink, the total heat resistance of the diode is relatively high, which limits the output power delivered by the diode.

BRIEF SUMMARY OF THE INVENTION

The aim of the invention is to overcome these drawbacks by providing an ultra-high frequency diode, particularly in the 94 GHz band, which is encapsulated in a case such that a pre-matched module is formed and which is equipped with a heat sink whose dimensions and the material which forms it provide high heat dissipation, and whose shape allows the pre-matched module geometry in the immediate neighborhood of the diode to be reconstituted so as to provide good radial impedance transformation.

To this end, the invention provides a pre-matched module for an ultra-high frequency diode with high heat dissipation, comprising a diode chip and a case in which the diode is mounted, the case comprising: a metal base forming a first connection; a dielectric ring surrounding the diode; a metal cap; a second metal connection in contact with the diode and with the face of the dielectric ring contacting the cap; the base of the case comprising a first part and a second part applied to each other and each formed by a diamond coated with metal on all its surfaces, the first base part having dimensions very much greater than those of the second base part, so that the second base part applied to the first base part forms a central stud, the diode being fixed to the upper face of the second base part and the face of the dielectric ring opposite that in contact with the cap being fixed to the upper face of the first base part, the respective dimensions of the two base parts being such that the cap provides, because of its dimensions and those of the second base part and of the dielectric ring, the radial impedance transformation of the diode, and such that the two base parts provide for removal of the heat released by the diode.

It will thus be readily understood that the presence of the two added diamonds, one of large dimensions and the other of small dimensions, and whose thermal conductivity, of the order of 10 W/cm°K. at 200° C., is very much greater than that of the gold in the prior art, will allow on the one hand the heat released by the diode during use thereof to be removed to a maximum by these diamonds and, on the other hand, the total thermal resistance of the diode to be reduced, so the output power of the diode to be increased. Moreover, the two metal coated and added diamonds, one of which forms a central stud or point, will reconstitute the usual form of the metal base of the case encapsulating the diode, which is required for providing good radial impedance transformation.

BRIEF DESCRIPTION OF THE DRAWINGS

Other features and advantages of the invention will be clearer from the following detailed description referring to the accompanying drawings, given solely by way of example and in which:

FIG. 1 is a diagram for matching the impedance of a diode to the space surrounding it;

FIG. 2 is a power curve of a diode as a function of the current or of the ambient temperature for a mediocre and a good impedance transformation; and FIG. 3 shows a case for encapsulating an impedance matched diode having high heat dissipation in accordance with the invention.

DETAILED DESCRIPTION OF THE PREFERRED EMBODIMENT

It will be recalled first of all that an ultra-high frequency diode chip working for example in the 94 GHz band, encapsulated and mounted in its case, has an impedance of the R+jX type, in which R represents the actual part of the resistance of the diode and X the imaginary part of this resistance, j being representative of the imaginary quantities. R is negative for an avalanche diode or a Gunn diode and is positive for a Schottky diode or a diode of another type.

FIG. 1 will better help understanding of the importance of the impedance matching of a diode to its encapsulating case.

In this figure, there is shown at A the diode in which the semiconductor chip is soldered on a metal base with a central stud or point and comprises an upper connection; let $\phi_i$ be the diameter of the metal stud on which diode A is soldered, $\phi_e$ the diameter of the base, i.e. also the inner diameter of the cavity, B the distance which separates the upper connection from the base and C the thickness of the diode or else the distance which separates the upper connection from the stud on which the chip is soldered. The diode chip is surrounded by a dielectric of given constant $\epsilon$, or by several dielectrics having different constants which give an average equivalent dielectric constant. Depending on the case, the dielectric which surrounds the chip is either air, or an insulator in the form of a resin. It can be demonstrated that if the impedance of the space surrounding the diode has a value $R_e + jX_e$, corrected for the periphery, there exists a single set of values $\phi_i$, $\phi_e$, B and C such that there is impedance matching of the semiconductor device, namely:

$$R_e = k_1 R \text{ and } X_e = k_2 X$$

However, in practice, it is sufficient for $k_1 R$ and $k_2 X$ to approximate $R_e$ and $X_e$ sufficiently for then the conventional mechanical tuning in the mounting becomes extremely easy; this is why it is called pre-matching and not matching.

This impedance transformation is extremely advantageous in particular for avalanche diodes, for it considerably simplifies the cavity; for example, biassing on the upper electrode may be achieved by means of a single fine wire.

Furthermore, and this is shown in FIG. 2, the curve of the power delivered P as a function of another variable such as the biassing current I or the inverse of the ambient temperature 1/T, changes monotonically without hysteresis or without snags. Thus, in FIG. 2, curve 1 represents the power curve of diodes encapsulated in a case without impedance matching: this curve does not have a regular variation, but on the contrary presents deviations, which vary moreover from one diode to another depending on the case. On the contrary, curve 2 which presents a very smooth variation, corresponds to a diode correctly encapsulated in a case with impedance matching.

This shows the importance that there is, especially at such frequencies close to 100 GHz, for a diode chip to be correctly encapsulated and mounted in its case, which forms a cavity, and preferably from parts formed collectively.

FIG. 3 shows a preferred case for encapsulating an ultra-high frequency diode with high heat dissipation, in accordance with the invention, such for example as a 94 GHz silicon avalanche diode, and sufficiently matched or pre-matched in impedance.

The case comprises first of all a metal or metal covered base formed by the three following parts.

The first base part is formed by a metal support 4 made from nickel or gold coated copper, with circular cross section and a diameter for example equal to 1.6 mm.

On this support 4 is secured, generally by brazing, the second base part formed by a high heat conductivity material such as a IIA diamond, shown at 6, which is a crystallographic variety of the diamond commercialized by the South African firm DRUCKER and whose heat conductivity is much greater than that of any metal, and in particular gold.

This first diamond 6 has for example a parallelepipedic shape with square cross section and has large dimensions, namely for example 750 microns square and 500 microns thick. This large diamond 6 is moreover coated with metal on all its faces by successive deposits of titanium (for example 300 Å), platinum (for example 600 Å) and gold (for example 1 micron).

The third base part of the case is also formed by a high conductivity material, such as a IIA diamond shown at 7, and fixed by thermocompression to the large diamond 6. Diamond 7 also has for example a parallelepipedic shape with square cross section and has dimensions much less than those of diamond 6, being for example 200 microns square and 50 microns thick. This small diamond 7 is also coated with metal on all its faces, by successive deposits of titanium, platinum and gold, as for the above-described large diamond 6.

Thus, because of the difference between the respective dimensions of the two diamonds 6 and 7, the small diamond 7 forms a central stud or point so that these two metal coated added diamonds reconstitute the same metal base form as shown in FIG. 1, which is indispensable for providing good radial impedance transformation.

It will be noted that the metal support 4 made from nickel and gold coated copper may also rise up around the large diamond 6, as shown by the broken lines, without departing from the scope and spirit of the invention; this is obtained either by electrolytic growth of copper before the nickel and gold deposits, or by crimping diamond 6 in support 4.

As is shown in FIG. 3, a diode chip 9, for example having a diameter of 45 microns and a thickness of 5 microns, is thermocompressed on the upper face of the small diamond 7. A dielectric ring 11, for example quartz which presents low losses in the 94 GHz band, is thermocompressed, bonded or brazed about the diode chip 9 on the upper face of the large diamond 6. Since this ring 11 serves for encapsulating the diode and is metal-coated on two of its faces 12 and 13, it has an outer diameter between 750 and 800 microns, an inner diameter between 350 and 400 microns and a thickness of the order of 120 microns.

An upper connection 15, for example in the form of a false beam-lead, is fixed to the diode chip 9: it bears on the upper face 13 of the quartz ring 11 and the assembly is closed by a metal cover or cap 17 made from gold coated copper, for example circular in cross section, and thermocompressed, bonded or brazed to the upper face of the quartz ring. Cap 17 has a diameter of the order of 1.1 to 1.2 mm and a thickness of 100 microns.

The connection 15 of the diode is for example of the type in the form of a metal star whose two arms are not flat, but extend away from the base, which reduces the parasite inductance and capacity.

Thus, during use of diode 9 under continuous operation or pulsed operation conditions, the two metal-coated diamonds 6 and 7, and more especially the large diamond 6, provide maximum removal of the heat released by the junction during operation, while allowing cap 17 to ensure, because of its diameter, the radial impedance transformation of diode 9 to the oscillation frequency of the module.

Consequently, the large (6) and small (7) added and metal-coated diamonds fulfill together a double function:

heat dissipation qualified as excellent because of the high heat conductivity material (diamond) forming the two base parts 6 and 7 and because of the large dimensions of diamond 6;

reconstitution of the usual form of a metal base for a case for encapsulating a diode because of the small dimensions of the central metal-coated diamond 7 with respect to those of the metal-coated diamond 6, to ensure good radial impedance transformation.

Moreover, it will be noted that if diamond 7 did not exist the self inductance introduced by the upper connection 15 would often be prohibitive.

What is claimed is:

1. A pre-matched module for an ultra-high frequency diode having a diode chip mounted in a case, said case comprising:
    a first metal-coated diamond base;
    a second metal-coated diamond base very much smaller than said first base, said second base being fixed to said first base so as to form a central stud, said diode chip being fixed to said second base, said first and second bases acting as a first electrical connection for said diode chip;
    a dielectric ring mounted on said first base and surrounding said second base and said diode;
    a metal cap mounted on said dielectric ring on the side oposite said first base, so as to form an enclosure around said second base and said diode;
    connection means extending from said diode to a joint between said dielectric ring and said metal cap to act as a second electrical connection for said diode chip;
    said first and second bases having high heat conductivity to dissipate the heat from said diode chip; and
    said first and second bases having dimensions and being arranged so as to form a radial impedance transformation base.

2. A pre-matched module as claimed in claim 1, wherein the diamond of each of said first and second bases is of IIA type.

3. A pre-matched module as claimed in claim 1 or 2, wherein each of said first and second bases has a parallelepipedic form with square cross section.

4. A pre-matched module as claimed in claim 3, wherein said first base is 750 microns square with a thickness of 500 microns and said second base is 200 microns square with a thickness of 50 microns.

5. A pre-matched module as claimed in claim 1, wherein said first and second bases are connected by a thermocompression bond.

6. A pre-matched module as claimed in claim 1, wherein said first and second bases each include a fist coating of titanium, a second coating of platinum, and a third coating of gold.

7. A pre-matched module as claimed in claim 1, wherein said dielectric ring and said first base are connected by a thermocompression bond.

8. A pre-matched module as claimed in claim 1, wherein said first base is fixed to a metal support, said metal support being copper with coatings of nickel and gold.

* * * * *